United States Patent
Jeong et al.

(10) Patent No.: US 8,916,883 B2
(45) Date of Patent: Dec. 23, 2014

(54) LIGHT EMITTING DEVICE AND METHOD FOR FABRICATING THE SAME

(75) Inventors: Hwan Hee Jeong, Seoul (KR); Sang Youl Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 50 days.

(21) Appl. No.: 13/215,693

(22) Filed: Aug. 23, 2011

(65) Prior Publication Data
US 2011/0317433 A1 Dec. 29, 2011

(30) Foreign Application Priority Data

Dec. 20, 2010 (KR) .......................... 10-2010-0130657
Dec. 23, 2010 (KR) .......................... 10-2010-0133432

(51) Int. Cl.
*H01L 33/60* (2010.01)
*H01L 33/38* (2010.01)
*F21K 99/00* (2010.01)
*F21Y 101/02* (2006.01)
*H01L 33/00* (2010.01)
*H01L 33/22* (2010.01)
*H01L 33/40* (2010.01)

(52) U.S. Cl.
CPC . *H01L 33/38* (2013.01); *F21K 9/00* (2013.01); *F21Y 2101/02* (2013.01); *H01L 33/0079* (2013.01); *H01L 33/22* (2013.01); *H01L 33/405* (2013.01); *H01L 2933/0016* (2013.01); *H01L 2224/48091* (2013.01); *H01L 2224/48247* (2013.01)
USPC ................. 257/79; 257/59; 257/72; 257/80; 257/88; 257/94; 257/98; 257/99; 257/443

(58) Field of Classification Search
CPC ..................................................... H01L 33/60

USPC .......... 257/79, 94, 98, 99, E33.062, E33.072, 257/E33.027, E33.068, E33.073, E33.067, 257/59, 72, 80, 88, 443
See application file for complete search history.

(56) References Cited

U.S. PATENT DOCUMENTS

| 2006/0273335 | A1* | 12/2006 | Asahara et al. ................. 257/98 |
| 2008/0185606 | A1* | 8/2008 | Sano et al. ...................... 257/98 |
| 2008/0315236 | A1 | 12/2008 | Lu et al. |
| 2009/0039367 | A1 | 2/2009 | Iso et al. |
| 2009/0134416 | A1 | 5/2009 | Lee |
| 2011/0089450 | A1* | 4/2011 | Jeong et al. ..................... 257/98 |

FOREIGN PATENT DOCUMENTS

| CN | 101009353 | 8/2007 |
| EP | 2216833 | 8/2010 |
| KR | 1020090053233 | 5/2009 |
| KR | 1020090116840 | 11/2009 |
| KR | 1020100005950 | 1/2010 |
| KR | 1020100016401 | 2/2010 |
| KR | 100986353 | 10/2010 |
| WO | 2008/092378 | 8/2008 |

OTHER PUBLICATIONS

European Search Report for 11179013.5 dated Nov. 28, 2013.

* cited by examiner

*Primary Examiner* — Chuong A Luu
(74) *Attorney, Agent, or Firm* — Lowe Hauptman & Ham, LLP

(57) ABSTRACT

A light emitting device includes a light emitting structure comprising a first conductivity type semiconductor layer, an active layer and a second conductivity type semiconductor layer; a reflective layer formed under the light emitting structure; and a transparent supporting layer formed between the light emitting structure and the reflective layer, to emit a light generated from the active layer; and a conductive layer formed under the reflective layer, to surround the reflective layer.

19 Claims, 11 Drawing Sheets

Laser

Luminuos intensity [ ncd ]

ated on Nov. 20,
LIGHT EMITTING DEVICE AND METHOD FOR FABRICATING THE SAME

CROSS REFERENCE TO RELATED APPLICATION

This application claims the benefit of the Patent Korean Application No. 10-2000-133432 filed on Nov. 23, 2010, and Korean Application No. 10-2000-130657 filed on Nov. 20, 2010 which is hereby incorporated by reference as if fully set forth herein.

BACKGROUND OF THE DISCLOSURE

1. Field of the Disclosure

The present invention relates to a light emitting device.

2. Discussion of the Related Art

Owing to development of thin film growth technology and a material used in a thin film device, a light emitting device including a light emitting diode and a laser diode, which uses 3-5 group or 2-6 group compound semiconductor elements of a semiconductor, can present a variety of colors, for example, red, green and blue colors and an infrared ray. The light emitting device can present a white light having good light efficiency, because it uses a fluorescence material or it performs color combination. Compared with a conventional light source such as a fluorescent lamp and an incandescent lamp, the light emitting device such as the light emitting diode and the laser diode has several advantages of low power consumption, semi-permanent usage, a fast response speed, safety and environment-friendliness.

The light emitting device has been applied to a transmission module of light communication means, a light emitting diode backlight replacing a cold cathode fluorescence lamp (CCFL) composing a backlight of a liquid crystal display (LCD) device, a white light emitting diode lightening device replacing a fluorescent lamp and an incandescent lamp, a headlight of an automobile and even to a traffic light broadly.

Optical efficiency of such the light emitting device is very important part used in determining the capacity of the light emitting device. It is required to invent a light emitting device capable of increasing optical efficiency and a method for fabricating the light emitting device.

SUMMARY

Accordingly, Embodiments are directed to a light emitting device and a method for fabricating the light emitting device.

The embodiments can improve light efficiency by improving light extraction efficiency.

Additional advantages, objects, and features of the disclosure will be set forth in part in the description which follows and in part will become apparent to those having ordinary skill in the art upon examination of the following or may be learned from the embodiments. The other advantages of the embodiments may be realized and attained by the structure particularly pointed out in the written description and claims hereof as well as the appended drawings. To achieve these objects and other advantages, as embodied and broadly described herein, a light emitting device includes a light emitting structure comprising a first conductivity type semiconductor layer, an active layer and a second conductivity type semiconductor layer; a reflective layer formed under the light emitting structure; and a transparent supporting layer formed between the light emitting structure and the reflective layer. The reflective layer includes at least one projection part formed toward the light emitting structure and side surfaces of the projection part are in contact with the transparent supporting layer.

In another aspect of the embodiments, a light emitting device includes a light emitting structure comprising a first conductivity type semiconductor layer, an active layer and a second conductivity type semiconductor layer; a reflective layer formed under the light emitting structure; and a transparent supporting layer formed between the light emitting structure and the reflective layer. The reflective layer includes an unevenness structure and the transparent supporting layer has a predetermined shape corresponding to a shape of the unevenness structure.

The light emitting device according to the embodiments of the present invention has en effect of improved light efficiency by improving side surface light extraction efficiency and an effect of improved stability and reliability with respect to the light emitting device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings.

DESCRIPTION OF SPECIFIC EMBODIMENTS

Figure 1:
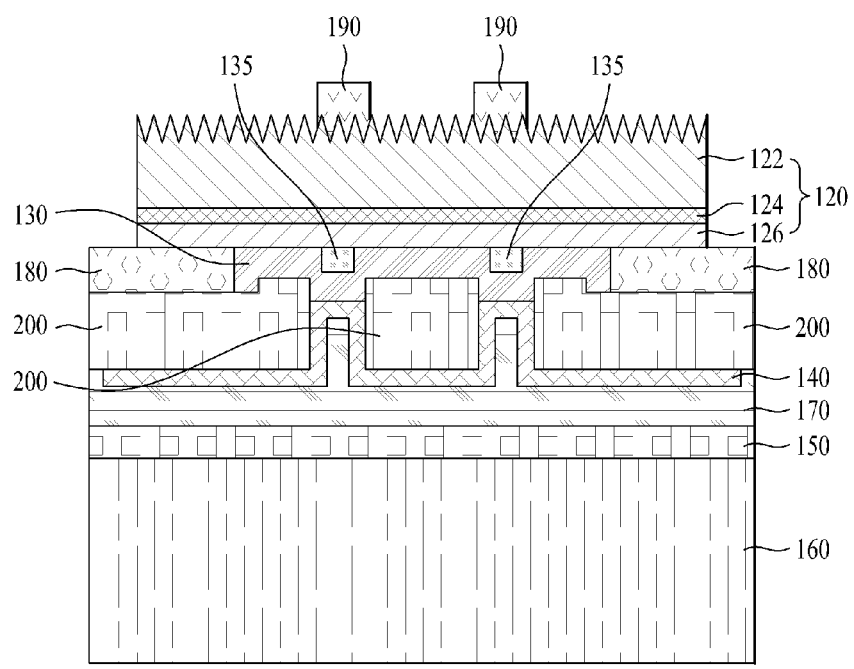
FIG. 1 is a diagram illustrating a light emitting device according to an embodiment.

As follows, embodiments will be described in reference to the accompanying drawings.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

The thickness and size of each layer may be exaggerated, emitted or illustrated schematically in the drawings, for explanation and precision. The size of each component shown in the drawings may not reflect the actual size completely.

FIG. 1 is a diagram illustrating a light emitting device including a light emitting diode according to an embodiment.

As shown in FIG. 1, the light emitting device according to this embodiment includes an adhesive layer 150 formed on a supporting substrate 160, a conductive layer 170 formed on the adhesive layer 150, a reflective layer 140 formed on the conductive layer 170, a transparent supporting layer 200 formed on the reflective layer 140, an ohmic layer 130 formed on the reflective layer 140 or the transparent supporting layer 200, a current blocking layer 135 formed on the ohmic layer 130, a protective layer 180 formed on the transparent supporting layer 200, a light emitting structure 120 having a first conductivity type semiconductor layer 122, an active layer 124 and a second conductivity type semiconductor layer 126, and a first electrode 190 formed on a predetermined area of the first conductivity type semiconductor 122.

As shown in the drawing, the adhesive layer 150 and the conductive layer 170 may be provided on the supporting substrate 160.

The conductive layer 170 may be formed of a selected material, for example a group including nickel (Ni), platinum (Pt), titan (Ti), tungsten (T), vanadium (V), iron (Fe) and molybdenum (Mo) or alloy selectively including the materials of the group.

The conductive layer 170 supports the light emitting structure 120 entirely and it can minimize mechanical damage which might be generated in a manufacture process of the light emitting device (for example, breakage or separation). In addition, the conductive layer 170 may prevent diffusion of the metal material composing the supporting substrate 160 or the adhesive layer 150 toward the light emitting structure 120. The conductive layer 170 is formed to surround the reflective layer 140 or the transparent supporting layer 200, to minimize the mechanical damage to the reflective layer 140 and the transparent supporting layer 200. For example, both ends of the conductive layer 170 are projected to surround the reflective layer 140.

The reflective layer 140 may be formed of aluminum (Al), silver (Ag), nickel (Ni), platinum (Pt), rhodium (Rh) or a metal layer including alloy of Al, Ag, Pt and Rh. Aluminum or silver may reflect lights generated from the active layer 124 effectively and improve light extraction efficiency of the light emitting device.

At this time, the reflective layer 140 may include at least one projection part formed toward the light emitting structure. Sides of the projection part may contact with the transparent supporting layer 200.

The transparent supporting layer 200 forms a path to emit the light of the active layer 124 toward a side surface of the light emitting device to broaden an orientation angle of the light emitting device and to improve side surface light emitting efficiency of the light emitting device.

In other words, in the conventional light emitting device according to the prior art, the light emitted from the active layer 124 is reflected by the reflective layer 140 to be extracted only to a top of the light emitting device. However, in the light emitting device according to this embodiment, the transparent supporting layer 200 changes an incidence angle of the light incident thereon from the active layer 124 or reflected by the reflective layer 140. After that, the transparent supporting layer 200 makes the light emitted to the sides thereof or the top of the light emitting device, to reduce the lights absorbed into the light emitting device after emitted to the supporting substrate 160 from the active layer 124 and to improve light efficiency.

Moreover, the light emitting device according to this embodiment forms the reflective layer 140 under the transparent supporting layer 200. Here, the length of the reflective layer 140 is larger than that of the reflective layer provided in the conventional light emitting device according to the prior art. Because of that, the light emitted from the active layer 124 may be irradiated not only to the top of the light emitting device but also the sides of the transparent supporting layer 200, such that the light efficiency of the light emitting device may be improved effectively.

The transparent supporting layer 200 may be formed of an insulative material with a light transmissivity which is a predetermined reference or more. The insulative material may be formed of a non-conductive oxide or nitride. For example, the transparent supporting layer 200 may be formed of a selected non-conductive material from silicon oxide ($SiO_2$) with a transmissivity of 70% or more, titanium oxide ($TiO_2$) and aluminum oxide ($Al_2O_3$) or a non-conductive material selectively including them.

The transparent supporting layer 200 may be formed in a sputtering deposition or chemical deposition process.

When the sputtering deposition is used, an ionized atom accelerated by an electric field is collided with a source material of the transparent supporting layer 200. In this case, atoms of the source are protruded and deposited. When the chemical vapor deposition is used, an oxide material with light transmissivity is deposited to generate chemical vapor deposition.

The thickness of the transparent supporting layer 200 may be a variety of values. The thickness may be determined to be a predetermined value which enables the light to be emitted toward side surfaces of the light emitting device, that is, side surfaces of the transparent supporting layer 200 from the active layer 200.

For example, the thickness of the transparent supporting layer 200 may be set to be in a range of 1 μm~100 μm.

An unevenness structure configured to emit the light from the active layer 124 may be formed in the side surface of the transparent supporting layer 200 according to an embodiment.

According to an embodiment, the ohmic layer 130 and the reflective layer 140 may be formed under the current blocking layer 130 to connect the ohmic layer 130 and the reflective layer 140 with each other electrically, without the transparent supporting layer 200.

The projection part of the reflective layer 140 may be overlapped with the current blocking layer 130 vertically.

The ohmic layer 130 may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Sn, In, Ru, Mg, Zn, Pt, Au and Hf. The ohmic layer 130 according to present invention may be limited thereto.

The protective layer 180 may include at least one of metal and insulation materials. When the protective layer 180 includes the metal material, a predetermined material with a lower electrical conductivity than the material composing the ohmic layer 130 is used for applying the power applied to the ohmic layer 130 not to the protective layer 180.

Such the protective layer 180 may include at least one of titanium (Ti), nickel (Ni), platinum (Pt), lead (Pb), rhodium (Rh), iridium (Ir) and tungsten (W) or it may include at least one of aluminum oxide ($Al_2O_3$), silicon oxide ($SiO_2$), silicon nitride ($Si_2N_4$) and titanium oxide ($TiO_x$) or at least one of indium Tin Oxide (ITO), aluminum zinc oxide (AZO) and indium zinc oxide (IZO). Here, it is preferable that the protective layer 180 includes at least one of titanium (Ti), nickel (Ni), platinum (Pt), tungsten (W), molybdenum (Mo), vanadium (V) and iron (Fe).

When the light emitting structure 120 is etched, the protective layer 180 may protect the parts located under the protective layer 180 from the etching process and it may support the light emitting device stably to protect the light emitting device from damage which might be generated in the fabrication process.

The first conductivity type semiconductor layer 122 may be realized as a 3-5 group compound semiconductor having a first conductivity type dopant doped thereon. When the first conductivity type semiconductor layer 112 is an N-type semiconductor layer, the first conductivity type dopant is an N-type dopant including Si, Ge, Sn, Se and Te. The present invention is not limited thereto. According to an embodiment, an unevenness structure may be formed on a surface of the first conductivity type semiconductor layer 122 and a profile of the unevenness according to the present invention is not limited.

The active layer 124 is a layer which emits a light having an energy determined by an energy band possessed by an active layer material (light emitting layer material) after an electron injected via the first conductivity type semiconductor layer 122 meets a hole injected via a second conductivity type semiconductor layer 126 formed later.

The second conductivity type semiconductor layer 126 may include a 3-5 group compound semiconductor having a second conductivity type dopant doped thereon, for example, a semiconductor material having an empirical formula of $In_xAl_yGa_{1-x-y}N$ ($0 \leq x \leq 1$, $0 \leq y \leq 1$, $0 \leq x+y \leq 1$). When the second conductivity type semiconductor layer 127 is a P-type semiconductor layer, the second conductivity type dopant is a P-type dopant including Mg, Zn, Ca, Sr and Ba.

A first electrode 190 is formed on at least a predetermined region of the first conductivity type semiconductor layer 122. The first electrode 190 is formed of a metal material selected from molybdenum (Mo), chrome (Cr), nickel (Ni), gold (Au), aluminum (Al), titanium (Ti), platinum (Pt), vanadium (V), tungsten (W), lead (Pd), copper (Cu), rhodium (Rh) and iridium (Ir) or alloy of the metals.

Detailed description of each part will be following in reference to FIGS. 2a to 2k.

Figure 2A:
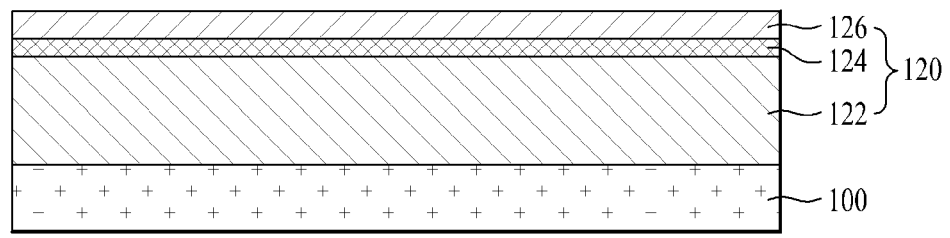
FIGS. 2a to 2k are diagrams illustrating a method for fabricating the light emitting device according to an embodiment.

FIGS. 2a to 2k are diagrams illustrating a method for fabricating the light emitting device according to an embodiment. As shown in FIG. 2a, the substrate 100 is prepared and the substrate 100 may be a conductive substrate or an insulative substrate. For example, the substrate 100 may use at least one of sapphire ($Al_2O_3$), siC, Si, GaAs, GaN, ZnO, Si, GaP, InP, Ge, and $Ga_2O_3$. An unevenness structure may be formed on the substrate and the present invention is not limited thereto.

Wet cleaning is performed to the substrate 100 and impurities may be eliminated from a surface of the substrate 100.

On the substrate 100 may be formed the light emitting structure 120 including the first conductivity type semiconductor layer 122, the active layer 124 and the second conductivity type semiconductor layer 126.

At this time, a buffer layer (not shown) may grow between the light emitting structure 120 and the substrate 100, to reduce material lattice mismatch and of thermal expansion coefficient difference between the materials. The buffer layer may be formed of 3-5 group compound semiconductor, for example, one of GaN, InN, AlN, InGaN, AlGaN, InAlGaN and AlInN. An undoped semiconductor layer may be formed on the buffer layer and the present invention is not limited thereto.

The light emitting structure 120 may be formed according to metal organic chemical vapor deposition (MOCVD), chemical vapor deposition (CVD), plasma-enhanced chemical vapor deposition (PECVD), molecular beam epitaxy (MBE) and hydride vapor phase epitaxy (HVPE). The present invention is not limited thereto.

The first conductivity type semiconductor layer 122 may be a 3-5 group compound semiconductor having a first conductivity type dopant doped thereon. When the first conductivity type semiconductor layer 112 is an N-type semiconductor, the first conductivity type dopant may be an N-type dopant including Si, Ge, Sn, Se and Te and the present invention is not limited thereto.

The first conductivity type semiconductor layer 122 may include a semiconductor material having an empirical formula of $Al_xIn_yGa_{(1-x-y)}N$ ($0 \leq x \leq 1$, $0 \leq y \leq 1$, $0 \leq x+y \leq 1$). For example, the first conductivity type semiconductor layer 122 may be formed of at least one of GaN, InN, AlN, InGaN, AlGaN, InAlGaN, AlInN, AlGaAs, InGaAs, AlInGaAs, GaP, AlGaP, InGaP, AlInGaP and InP.

The first conductivity type semiconductor layer 122 may form an N-type GaN layer based on the chemical vapor deposition (CVD), the molecular beam epitaxy (MBE), the sputtering or the hydride vapor phase epitaxy (HVPE). The first conductivity type semiconductor layer 122 may be formed by injecting silane gas ($SiH_4$) with N-type impurities such as trimethylgallium gas (TMGa), ammonia gas ($NH_3$), nitrogen gas ($N_2$) and silicon (Si) into a chamber.

The active layer 124 is a layer which emits a light having an energy determined by a unique energy band of the material composing the active layer (the light emitting layer) after carriers injected via the first conductivity type semiconductor layer 122 meet carriers injected via the second conductivity type semiconductor layer 126.

The active layer 124 may be formed in at least one of multi quantum well (MQW), quantum-wire and quantum dot structures. For example, trimethylgallium gas (TMGa), ammonia gas ($NH_3$), nitrogen gas ($N_2$) and trimethylindium gas (TMIn) are injected to form a multiquantum well structure (MQW) and the present invention is not limited thereto.

A Well/barrier layer may be formed in a pair structure including at least one of InGaN/GaN, InGaN/InGaN, GaN/AlGaN/, InAlGaN/GaN, GaAs(InGaAs), /AlGaAs and GaP (InGaP)/AlGaP and the present invention is not limited thereto. The well layer may be formed of a material with a band gap which is lower than a band gap of the barrier layer.

A conductivity type clad layer (not shown) may be formed on or under the active layer 124. The conductivity type clad layer may be an AlGaN based semiconductor and it may have a higher band gap than the band gap of the active layer 124.

The second conductivity type semiconductor layer 126 may include a 3-5 group compound semiconductor having a second conductivity type dopant doped thereon, for example, a semiconductor material having an empirical formula of $In_xAl_yGa_{1-x-y}N$ ($0 \leq x \leq 1$, $0 \leq y \leq 1$, $0 \leq x+y \leq 1$). When the second conductivity type semiconductor layer 126 is a P-type semiconductor layer, the second conductivity type dopant may be a P-type dopant including Mg, Zn, Ca, Sr and Ba.

The second conductivity type semiconductor layer 26 may form a P-type GaN layer by injecting bicetylcyclo pentadieny magnesium ((EtCp$_2$Mg){Mg(C$_2$H$_5$C$_5$H$_4$)2} including a P-type impurity such as trimethylgallium gas (TMGa), ammonia gas (NH$_3$), nitrogen gas (N$_2$) and magnesium (Mg) into a chamber. The present invention is not limited thereto.

According to an embodiment, the first conductivity type semiconductor layer 122 may be a P-type semiconductor layer and the second conductivity type semiconductor layer 126 may be an N-type semiconductor layer. On the second conductivity type semiconductor layer 126 may be formed a semiconductor layer having an opposite polarity with respect to the second conductivity type. For example, When the second conductivity type semiconductor layer is a P-type semiconductor layer, an N-type semiconductor layer (not shown) may be formed on the second conductivity type semiconductor layer 126. As a result, the light emitting structure 110 may be realized in at least one of N-P junction, P-N junction, N-P-N junction and P-N-P junction structures.

Figure 2B:
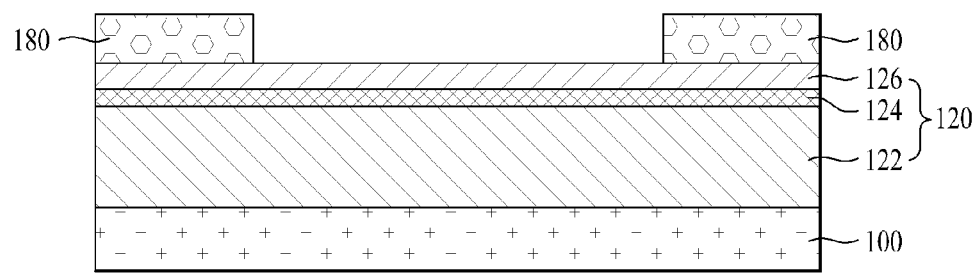

As shown in FIG. 2b, the protective layer 180 is layered on the second conductivity type semiconductor layer 126. Here, the protective layer 180 may be formed of an insulative material and the insulative material may be formed of a non-conductive oxide or nitride. For example, the protective layer 180 may be configured of a silicon oxide (SiO$_2$) layer, a silicon nitride (Si$_3$N$_4$) layer and a titanium oxide (TiOx) or aluminum oxide layer. When etching the light emitting structure 120 which will be described in detail later, the protective layer 180 protects the parts located there under from the etching process and it supports the light emitting structure stably to protect the light emitting structure from damage which might be generated in the fabrication process.

After that, the protective layer 180 is etched and a recess is formed. This formation of the recess may be performed in a dry etch process using a mask.

Figure 2C:
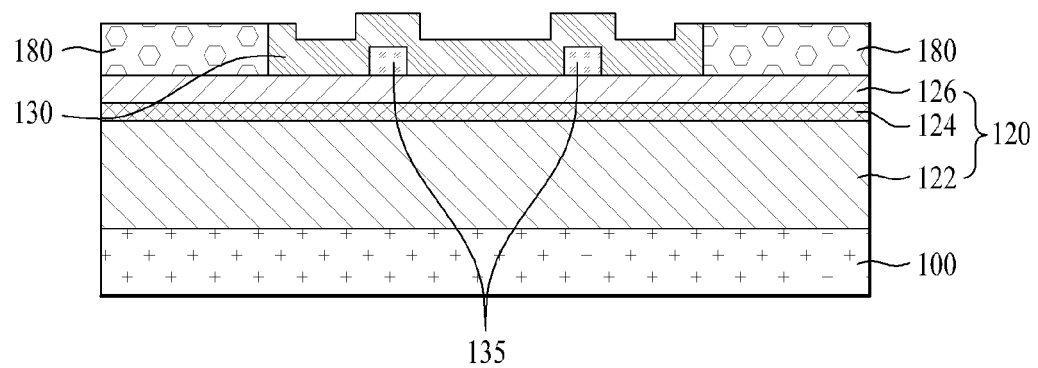

As shown in FIG. 2c, the ohmic layer 130 and the current blocking layer 135 are layered on the second conductivity type semiconductor layer 126 located in the recess.

At this time, the ohmic layer 130 may be layered, with a thickness of approximately 200 angstroms. The ohmic layer 130 may selectively use a transmissivity conductive layer and a metal. For example, the ohmic layer 130 may include indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, and Ni/IrOx/Au and at least one of Ni/IrOx/Au/ITO, Ag, Ni, Cr, Ti, Al, Rh, Pd, Ir, Sn, In, Ru, Mg, Zn, Pt, Au and Hf. The present invention is not limited to those materials. The ohmic layer 130 may be formed based on sputtering or electronic beam deposition. According to an embodiment, a recess is formed on the ohmic layer 130 and the current blocking layer 135 is formed in the recess. Current flow is dispersed horizontally and errors of the light emitting device generated by over-currents may be prevented to enhance stability and reliability of the light emitting device effectively.

The current blocking layer 135 may be formed between the ohmic layer 130 and the light emitting structure 120. A material with a lower electric conductivity than the reflective layer 140 or the ohmic layer 130, a material forming schottky contact with the second conductivity type semiconductor layer 126 or an electrically insulative material may be used to form the current blocking layer 135. For example, the current blocking layer 135 may include at least one of ZnO, SiO$_2$, SiON, Si$_3$N$_4$, Al$_2$O$_3$, TiO$_2$, Ti, Al and Cr.

The current blocking layer 135 may be formed between the ohmic layer 130 and the second conductivity type semiconductor layer 126 or between the reflective layer 140 and the ohmic layer 130, and the present invention is not limited thereto. The current blocking layer 135 allows currents to flow broadly within the light emitting structure 120, not necessarily provided.

Figure 2D:
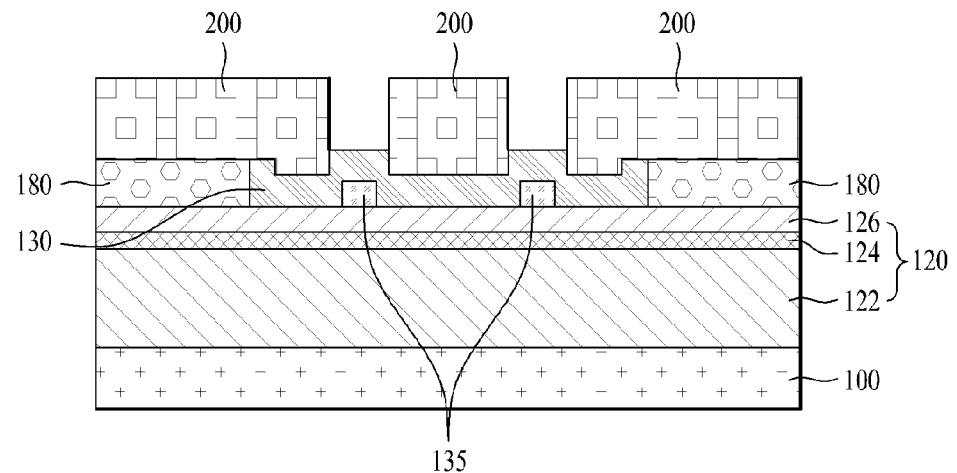

As shown in FIG. 2d, the transparent supporting layer 200 is formed on the ohmic layer 130 or the protective layer 180. The transparent supporting layer 200 forms a path to emit the light of the active layer 124 toward a side surface of the light emitting device to enlarge an orientation angle of the light emitting device and to improve side surface light emitting efficiency of the light emitting device.

The transparent supporting layer 200 may be formed of an insulative material with a light transmissivity which is a predetermined reference or more. The insulative material may be formed of a non-conductive oxide or nitride. For example, the transparent supporting layer 200 may be configured of a silicon oxide (SiO$_2$) layer, a titanium oxide (TiO$_2$) layer or an aluminum oxide (Al$_2$O$_3$).

The transparent supporting layer 200 may be formed in a sputtering deposition or chemical deposition process.

When the sputtering deposition is used, an ionized atom accelerated by an electric field is collided with a source material of the transparent supporting layer 200. In this case, atoms of the source are protruded and deposited. When the chemical vapor deposition is used, an oxide material with light transmissivity is deposited to generate chemical vapor deposition.

The thickness of the transparent supporting layer 200 may be a variety of values. The thickness may be determined to be a predetermined value which enables the light to be emitted toward side surfaces of the light emitting device, that is, side surfaces of the transparent supporting layer 200 from the active layer 200.

For example, the thickness of the transparent supporting layer 200 may be set to be in a range of 1 μm~100 μm.

An unevenness structure configured to emit the light from the active layer 124 may be formed in the side surface of the transparent supporting layer 200 according to an embodiment.

According to an embodiment, the ohmic layer 130 and the reflective layer 140 may be formed under the current blocking layer 130 to connect the ohmic layer 130 and the reflective layer 140 with each other electrically, without the transparent supporting layer 200.

Figure 2E:
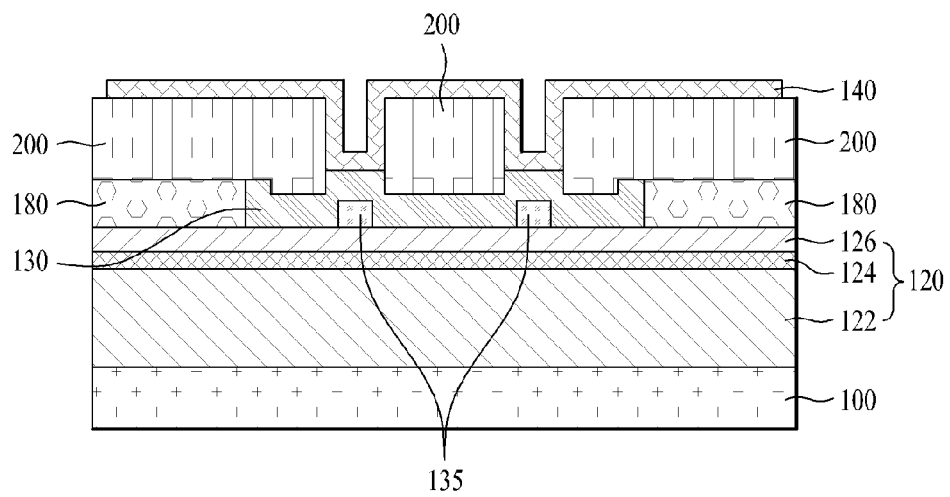

As shown in FIG. 2e, the reflective layer 140 is formed on the ohmic layer 130 or the transparent supporting layer 200.

The reflective layer 140 formed on the ohmic layer 130 or the transparent supporting layer 200 may have a thickness of approximately 2500 angstroms. The reflective layer 140 may be formed of a metal including at least one of Ag, Ni, Al, Rh, Pd, Ir, Ru, Mg, Zn, Pt, Au and Hf or alloy of them. Alternatively, the reflective layer 140 may be formed of a multi-layer using the metal or the alloy of them and a transmissivity conductive material such as ITO, IZO, IZTO, IAZO, IGZO, IGTO, AZO and ATO. In detail, the reflective layer 140 may be multilayered of IZO/Ni, AZO/Ag, IZO/Ag/Ni, AZO/Ag/Ni, Ag/Cu and Ag/Pd/Cu. Aluminum or silver can reflect the light generated from the active layer 124 effectively, to enhance light extraction efficiency of the light emitting device remarkably.

Especially, the reflective layer 140 may reflect the light incident thereon from the active layer 124 via the transparent supporting layer 200 toward a front surface and side surfaces of the transparent supporting layer 200. Because of that, light extraction efficiency of the light emitting device may be improved. At this time, the reflective layer 140 may include at least one projection part formed toward the light emitting structure and a side surface of the projection part may in contact with the transparent supporting layer 200. The projection part of the reflective layer 140 may be vertically overlapped with the current blocking layer 135.

Figure 2F:
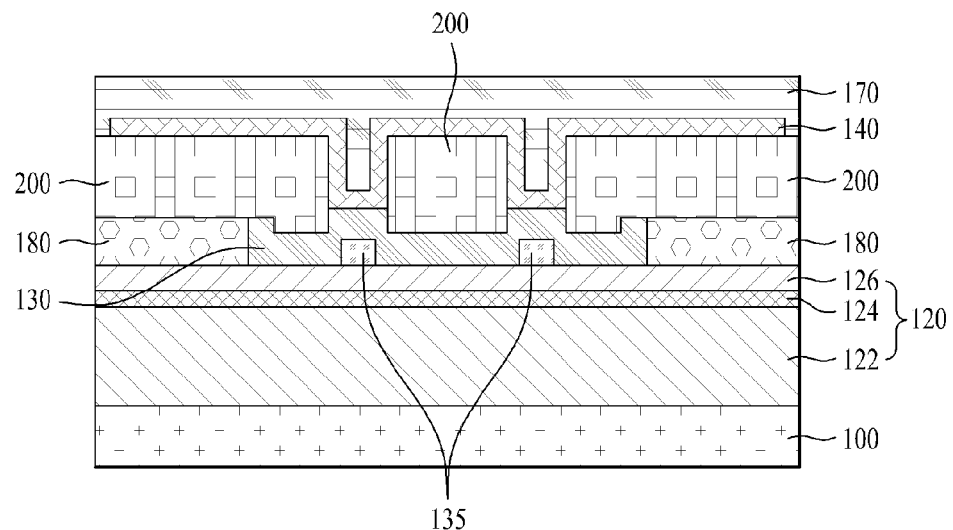

As shown in FIG. 2f, the conductive layer 170 is formed on the reflective layer 140. The conductive layer 170 may be formed of a selected material from a group including nickel (Ni), platinum (Pt), titanium (Ti), tungsten (T), vanadium (V), iron (Fe) and molybdenum (Mo) or alloy selectively including the materials of the group.

At this time, the conductive layer 170 may be formed according to sputtering deposition. When the conductive layer 170 is formed according to the sputtering deposition, an ionized atom accelerated by an electric field is collided with a source material of the conductive layer 170. In this case, atoms of the source are protruded and deposited. According to an embodiment, electric chemical metal deposition or bonding which uses a eutectic metal may be used to form the conductive layer 170. According to an embodiment, a plurality of conductive layers 170 may be formed.

The conductive layer 170 supports the light emitting structure 120 entirely and it has an effect of minimizing mechanical damage which might be generated in a manufacture process of the light emitting device (for example, breakage or separation).

Especially, the conductive layer 170 may prevent diffusion of the metal material composing the supporting substrate 160 or the adhesive layer 150 toward the light emitting structure 120. The conductive layer 170 is formed to surround the reflective layer 140 or the transparent supporting layer 200, to minimize the mechanical damage to the reflective layer 140 and the transparent supporting layer 200. For example, both ends of the conductive layer 170 are projected to surround the reflective layer 140.

Figure 2G:
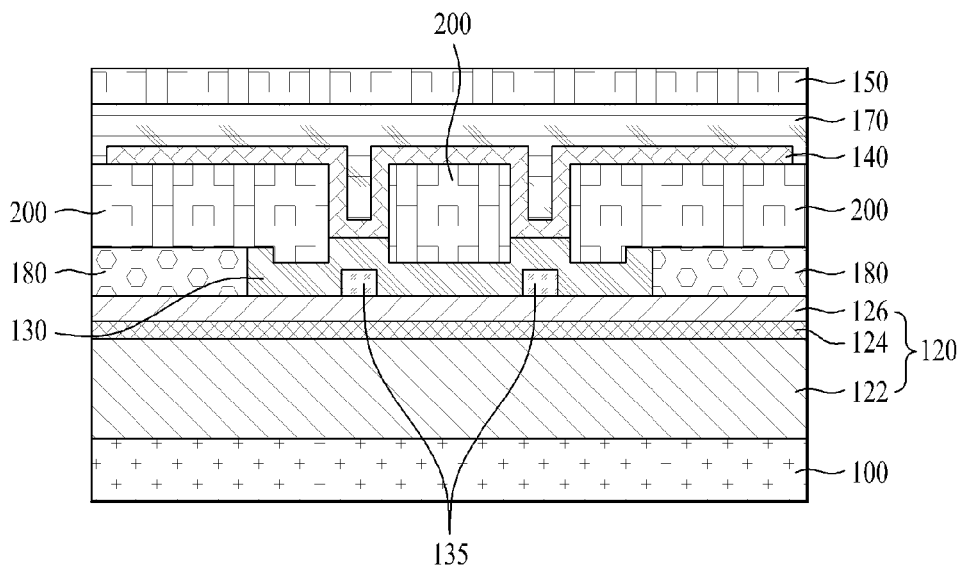

As shown in FIG. 2g, the adhesive layer 150 may be formed on the conductive layer 70 to bond the conductive layer 170 with the supporting substrate 160. The adhesive layer 150 may be formed of a selected material from gold (Au), tin (Sn), indium (In), silver (Ag), nickel (Ni), niobium (Nb) and copper (Cu) or alloy of those materials.

Figure 2H:
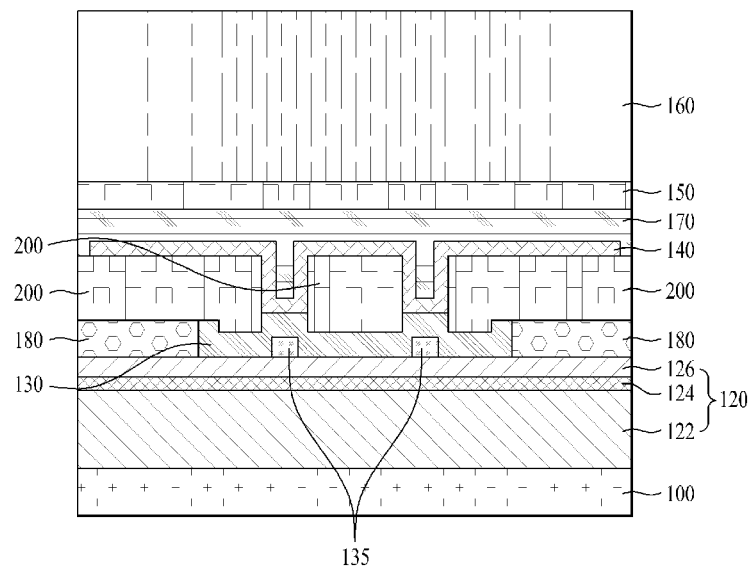

As shown in FIG. 2h, the supporting substrate 160 may be formed on the adhesive layer 150.

The supporting substrate 160 may be formed of a material selected from a group including molybdenum (Mo), silicon (Si), tungsten (W), copper (Cu) and aluminum (Al) or alloy of the group. The supporting substrate 160 may selectively include gold (Au), copper alloy (Cu Alloy), nickel (Ni), copper-tungsten (Cu—W), carrier wafer (for example, GaN, Si, Ge, GaAs, ZnO, SiGe, SiC, SiGe and $Ga_2O_3$). Electrochemical metal deposition or bonding which uses a eutectic metal may be used to form the conductivity supporting substrate 160.

According to an embodiment, When a hole is injected to the second conductivity semiconductor layer 126 via the conductive layer 170, the supporting substrate 160 may be formed of an insulative material and the insulative material may be an oxide or a nitride. For example, the supporting substrate 160 may be configured of a silicon oxide ($SiO_2$) layer, a nitride oxide layer and an aluminum oxide layer.

Figure 2I:
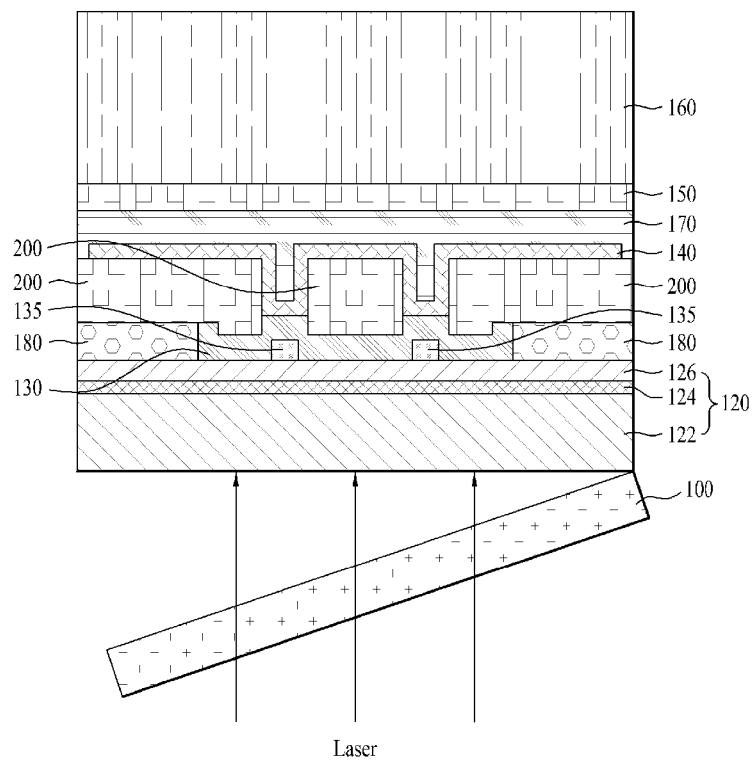

As shown in FIG. 2i, the substrate 100 is separated.

The separation of the substrate 100 may be performed according to Laser Lift Off (LLO) which uses an excimer laser beam and Dry/Wet Etch.

According to the Lift Off, when an excimer laser beam having a predetermined wavelength is focused and irritated, a thermal energy is concentrated on a boundary between the substrate 100 and the light emitting structure 120. Because of that, the boundary is divided into gallium and nitride molecules. At the same time, the separation of the substrate 100 momentarily occurs at a region where the laser beam passes.

Figure 2J:
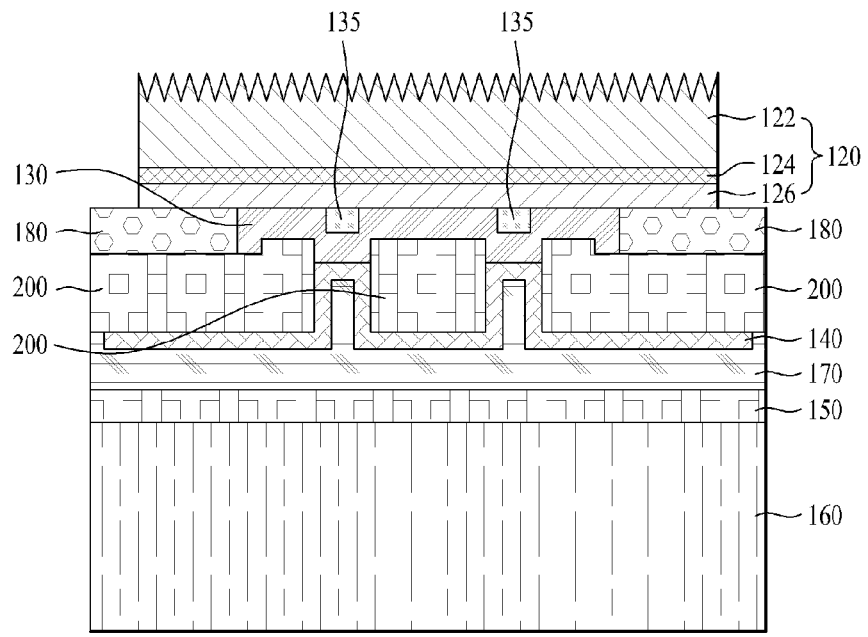

Hence, as shown in FIG. 2j, side surfaces of the light emitting structure 120 are etched. At this time, a material composing the protective layer 180 is detected by end point detecting to stop the etching and the side surfaces of the light emitting structure 120 may be partially etched.

At this time, an etching position may be controlled to locate the protective layer 180 under the light emitting structure 120 which is being etched.

When the light emitting structure 120 is etched, the protective layer 180 protects the parts located under the protective layer 180 from the etching and it supports the light emitting structure stably, to protect the light emitting structure from damage which might be generated in the fabrication process.

The unevenness structure is formed on the first conductivity type semiconductor layer 122, to enhance light extraction efficiency. At this time, the unevenness structure may be formed by PEC or etching after forming a mask.

According to the PEC, an etching velocity I adjusted based on the amount of etching liquid (for example, KOH or NaOH) and GaN crystallization to adjust the profile of the micro-sized unevenness. The unevenness structure may be formed periodically or non-periodically.

According to an embodiment, a 2D photonic crystal may be formed on a surface of the first conductivity type semiconductor layer 122. The structure of the 2D photonic crystal may be achieved by periodically arranging at least two dielectric substances having different refraction indexes corresponding a half of the wavelength possessed by the light. At this time, each of the dielectric substances may be provided in the same pattern.

The photonic crystal forms a photonic band gap on a surface of the first conductivity type semiconductor layer 122, to control the flow of the lights.

Such the recess and pattern structure of the light emitting structure may increase a surface area of the light emitting structure and improve a light extraction effect accordingly. The micro-unevenness structure formed on the surface of the light emitting structure may decrease lights absorbed into the light emitting structure and enhance light emitting efficiency accordingly.

Figure 2K:
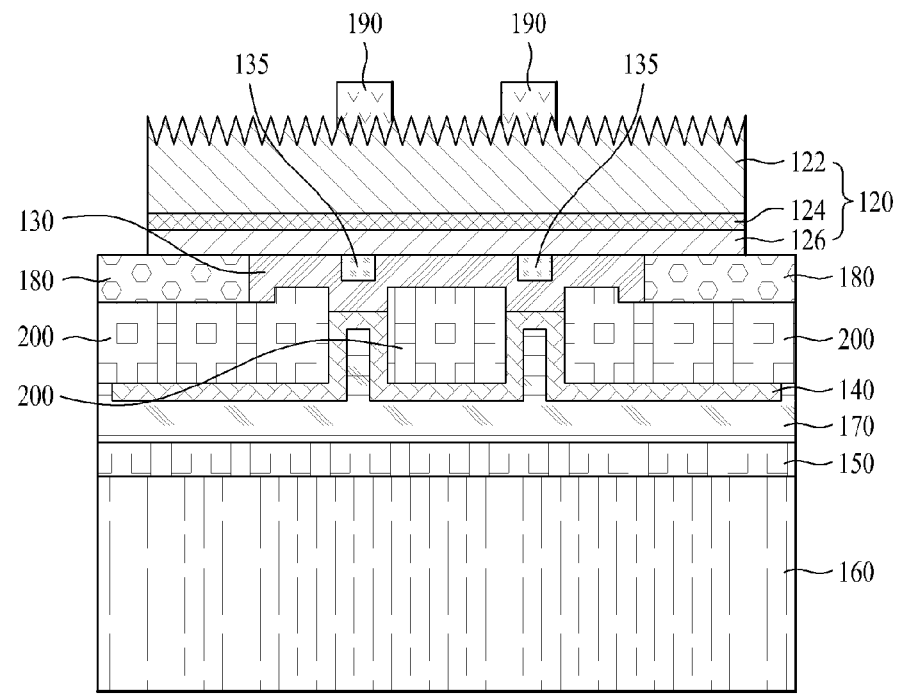

As shown in FIG. 2k, the first electrode 190 may be formed on at least a predetermined region of the first conductivity type semiconductor layer 122 and on the side surfaces of the light emitting structure 120.

The first electrode 190 may be formed of a metal material selected from molybdenum (Mo), chrome (Cr), nickel (Ni), gold (Au), aluminum (Al), titanium (Ti), platinum (Pt), vanadium (V), tungsten (W), lead (Pd), copper (Cu) rhodium (Rh) and iridium (Ir) or alloy of the metals.

Figure 3:
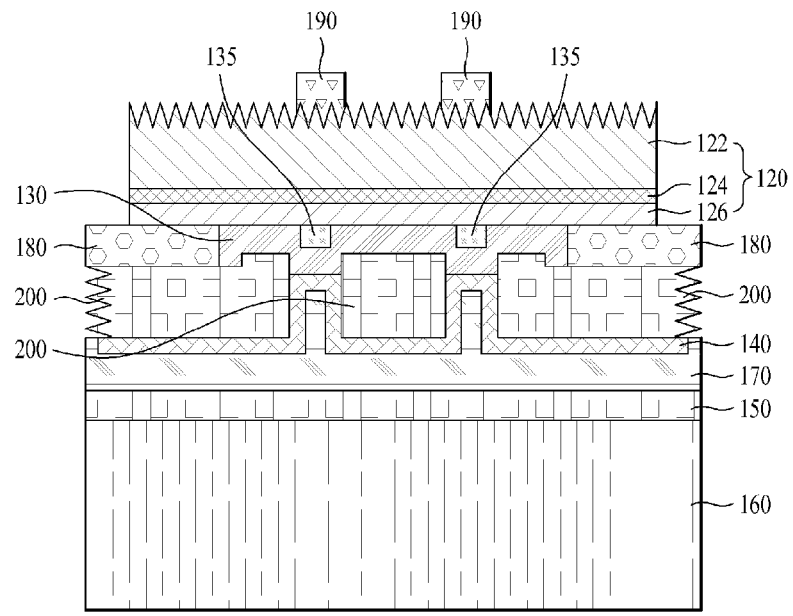
FIG. 3 is a diagram illustrating a light emitting device according to another embodiment.

FIG. 3 is a diagram illustrating a light emitting structure according to another embodiment of the present invention.

In reference to FIG. 3, an unevenness structure may be formed in side surfaces of a transparent supporting layer 200 provided in the light emitting structure according to this embodiment, to emit a light generated from an active layer 124. At this time, the unevenness structure may be formed periodically or non-periodically. A shape of the unevenness is not limited to a specific one and the shape may be variable. For example, the shape of the unevenness may be all of single or multi types including a square, a hemisphere, a triangle, a trapezoid, a multi-layer and a multi-step.

The unevenness structure may be formed in a wet etching process, a dry etching process or a wet/dry etching process. The dry etching may include plasma etching, sputter etching and ion etching. The wet etching may include photo chemical wet etching (PEC).

In case of the PED process, the amount of etching liquid (for example, KOH) and a difference of etching velocities generated by crystallization of a transparent supporting layer 200 may be adjusted, to adjust the shape of the micro-sized unevenness. After a mask is formed, etching is performed to adjust the shape of the unevenness.

As a result, the light emitting device forms a path to guide the lights generated from an active layer 124 toward the side surfaces of the light emitting device and side surface light emitting efficiency may be improved effectively. Especially, a reflective layer 140 reflects a light incident thereon from the active layer 124 via the transparent supporting layer 200 toward a front surface and side surfaces of the transparent supporting layer 200. Because of that, light extraction efficiency may be improved.

Figure 4:
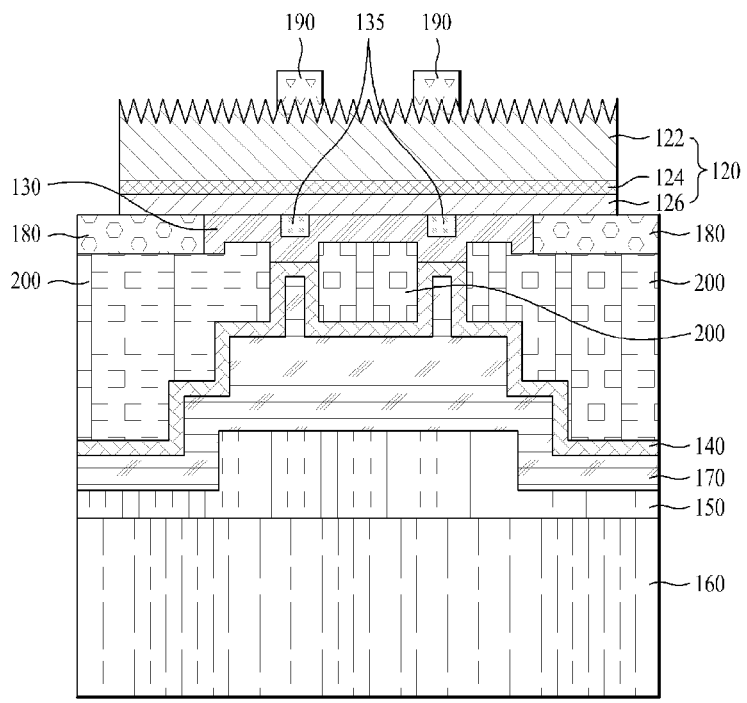
FIG. 4 is a diagram illustrating an effect of an improved orientation angle of the light emitting device according to the present invention.

FIG. 4 is a diagram illustrating a light emitting device according to a further embodiment of the present invention.

According to this embodiment, an unevenness structure may be formed under a transparent supporting layer 200. When the unevenness structure is formed under the transparent supporting layer 200 according to this embodiment, a reflective layer 140 and a conductive layer 170 may be formed in an unevenness structure correspondingly.

The unevenness structure formed under the reflective layer 140 may vary a reflection angle of a light incident on the transparent supporting layer 200 after reflected by the reflective layer 140, to emit the light toward side surfaces of the transparent supporting layer 200 and to reduce lights absorbed into a light emitting structure from the active layer 124. Because of that, light emitting efficiency may be enhanced. The unevenness structure may be formed periodically or non-periodically. A shape of the unevenness may be variable, not limited to a specific one.

For example, the shape of the unevenness may be all of single or multi types including a square, a hemisphere, a triangle, a trapezoid, a multi-layer and a multi-step.

The shape of the unevenness formed on the reflective layer 140 or the transparent supporting layer 200 may include at least one projection part formed toward the light emitting structure or a plurality of step structures.

For example, the reflective layer 140 or the transparent supporting layer 200 may be configured of a multi-layer, for example, three layers.

The unevenness structure may be formed in a wet etching process, a dry etching process or a wet/dry etching process. At this time, the shape of the unevenness may be adjusted by etching performed after a mask is formed.

The dry etching may use plasma etching, sputter etching and ion etching. The wet etching may use photo chemical wet-etching (PEC). Here, in case of the PEC process, the amount of etching liquid (for example, KOH) and a difference of etching velocities generated by GaN crystallization may be adjusted, to adjust the shape of the micro-sized unevenness.

According to this embodiment, the transparent supporting layer 200 may be configured of a plurality of multi-layers and the thickness of each layer may be set to belong to a range of 1 μm~100 μm.

According to an embodiment, the structure of the unevenness structure formed under the transparent supporting layer 200 may be a multi-step structure.

When the transparent supporting layer 200 is configured of a plurality of layers, the reflective layer 140 and the conductive layer 170 formed under the transparent supporting layer 200 may be configured of a plurality of layers.

When the multi-step structure is formed under the transparent supporting layer 200, the reflective layer 140 and the conductive layer 170 may be configured of a corresponding multi-step structure.

When the transparent supporting layer 200 is configured of the plurality of the layers or steps, a side surface area of the transparent supporting layer 200 may be enlarged and side surface light extraction efficiency of the light emitting device may be improved remarkably.

In case the reflective layer 140 and the conductive layer 170 are configured of the plurality of the layers or configured of the unevenness structure, the light emitting device may be supported stably and there maybe an effect of reduced mechanical damage (breakage or separation) which might be generated in the fabrication process of the light emitting device.

In addition, according to an embodiment, a light extraction structure may be formed in the side surfaces of the transparent supporting layer 200 to emit the light generated in the active layer 124. Because of that, side surface light extraction efficiency of the light emitting device may be improved.

According to an embodiment, a plurality of penetration parts may be formed on a top of the transparent supporting layer 200 and the adhesion between the transparent supporting layer 200 and the ohmic layer 130 may be improved accordingly.

When the unevenness structure is formed on a top of the transparent supporting layer 200 according to an embodiment, the transparent supporting layer 200 may contact with the second conductivity type semiconductor layer 126.

Figure 5:
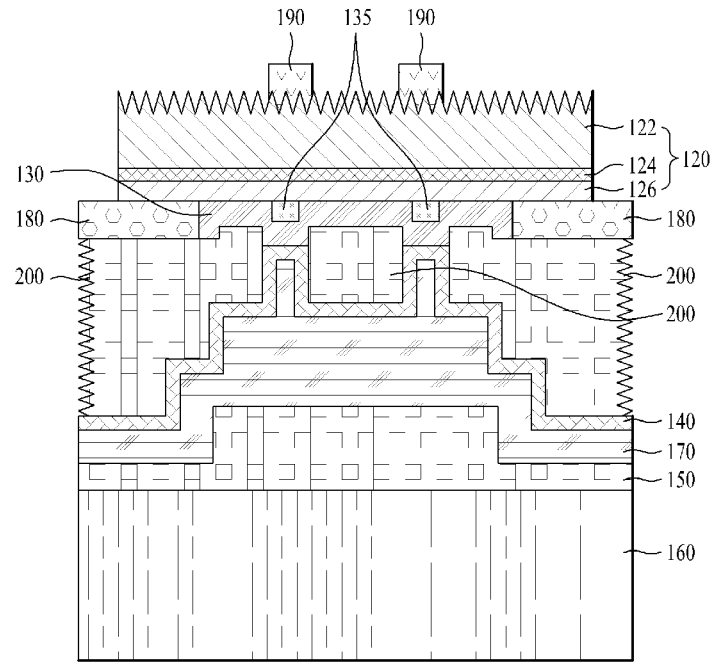
FIG. 5 is a diagram illustrating a light emitting device package according to an embodiment.

FIG. 5 is a diagram illustrating a light emitting device according to a still further embodiment of the present invention.

In reference to FIG. 5, an unevenness structure, that is, a light extraction structure may be formed in side surfaces of a transparent supporting layer 200 configured of a plurality of layers or steps to emit a light generated from an active layer 124. The light extraction structure formed in the side surface of the transparent supporting layer 200 may vary an incidence angle of the light incident on the side surface of the transparent supporting layer 200, only to reduce full reflection generated in a surface of the transparent supporting layer 200. Because of that, a side surface light extraction effect of the light emitting device may be achieved and light extraction efficiency may be enhanced.

The light extraction structure formed in the side surface of the transparent supporting layer 200 may be formed periodically or non-periodically. A shape of the light extraction structure may be variable, not be limited to a specific one.

For example, the shape of the light extraction structure may include all of single or multi types including a square, a hemisphere, a triangle, a trapezoid, a multi-layer and a multi-step.

The light extraction structure may use a wet etching process, a dry etching process or a wet/dry etching process. At this time, the shape of the light extraction structure may be adjusted by etching performed after a mask is formed.

The dry etching may use plasma etching, sputter etching and ion etching. The wet etching may use photo chemical wet-etching (PEC). Here, in case of the PEC process, the amount of etching liquid (for example, KOH) and a difference of etching velocities generated by GaN crystallization may be adjusted, to adjust the shape of the micro-sized light extraction structure.

As a result, the light emitting device forms the path to emit the light generated from the active layer 124 toward the side surfaces of the light emitting device and it forms the light extraction structure in the side surfaces of the transparent supporting layer 200. Because of that, the light emitting device has an effect of improved light extraction efficiency. Especially, the reflective layer 140 may reflect the light incident thereon from the active layer 124 via the transparent supporting layer 200 toward a front surface and side surfaces of the transparent supporting layer 200. Because of that, light extraction efficiency of the light emitting device may be improved.

Figure 6:
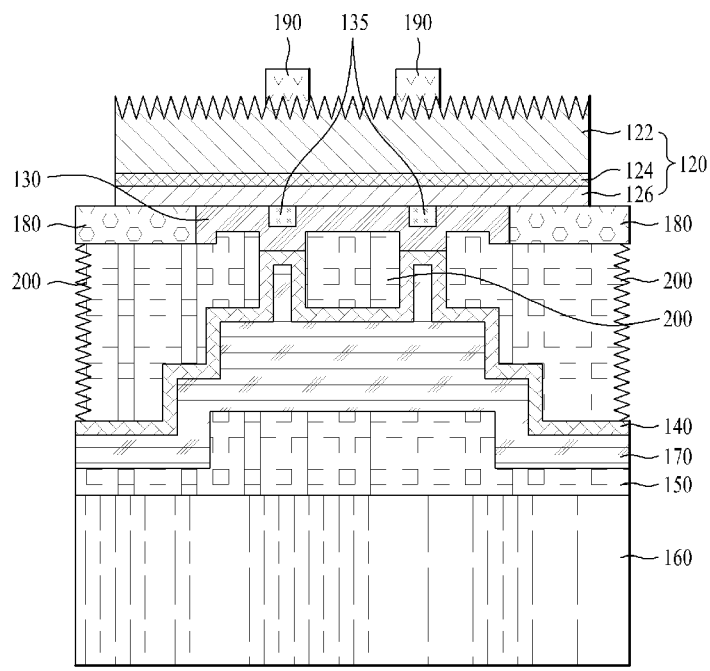
FIG. 6 is a diagram illustrating a light emitting device according to a still further embodiment of the present invention.

FIG. 6 is a diagram illustrating a light emitting device according to a still further embodiment of the present invention.

In reference to FIG. 6, a plurality of through parts are formed on a top of a transparent supporting layer 200 according to this embodiment, to improve adhesion between a transparent supporting layer and an ohmic layer 130. In other words, a predetermined region of the transparent supporting layer 200 may include a plurality of through parts which contacts with a light emitting structure by passing through the ohmic layer 130.

When the plurality of the through parts are formed on the top of the transparent supporting layer 200 according to this embodiment, the transparent supporting layer 200 and the second conductivity type semiconductor layer 126 may be in contact.

The plurality of the through parts formed on the side surfaces or the top of the transparent supporting layer 200 may be formed periodically or non-periodically. A shape of the through part may be variable, not limited to a specific one.

For example, the shape of the through part may include all of single or multi types including a square, a hemisphere, a triangle, a trapezoid, a multi-layer and a multi-step.

The through part structure may use a wet etching process, a dry etching process or a wet/dry etching process. At this time, the shape of the through part may be adjusted by etching performed after a mask is formed.

The dry etching may use plasma etching, sputter etching and ion etching. The wet etching may use photo chemical wet-etching (PEC). Here, in case of the PEC process, the amount of etching liquid (for example, KOH) and a difference of etching velocities generated by GaN crystallization may be adjusted, to adjust the shape of the micro-sized through part.

Figure 7:
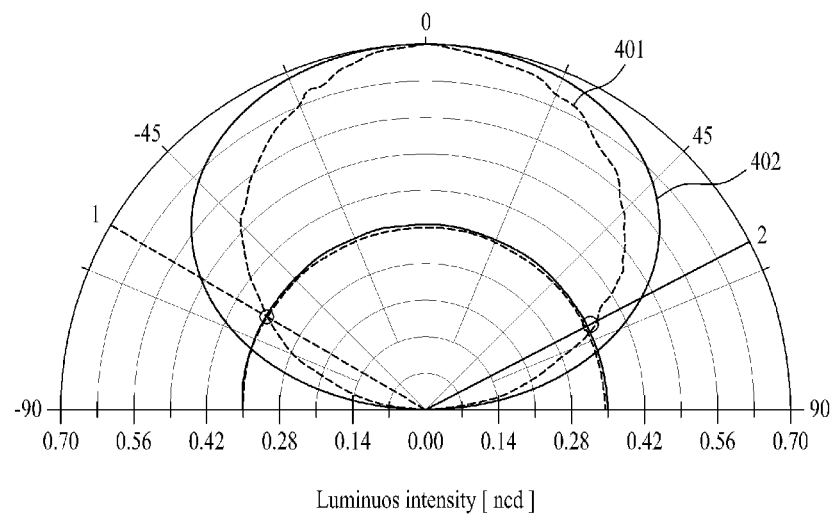
FIG. 7 is a diagram illustrating an effect of an improved orientation angle of the light emitting device according to the embodiments.

FIG. 7 is a diagram illustrating an effect of an improved orientation angle of the light emitting device according to the embodiments.

In reference to FIG. 7, it is shown that a range of orientation angles 402 of the light emitting device according to the embodiments is broadened, compared with an orientation angle 401 of the light emitting device according to the prior art. This is because the light emitting device according to the embodiments includes the transparent supporting layer as mentioned above and because the side surface light extraction efficiency is improved.

Figure 8:
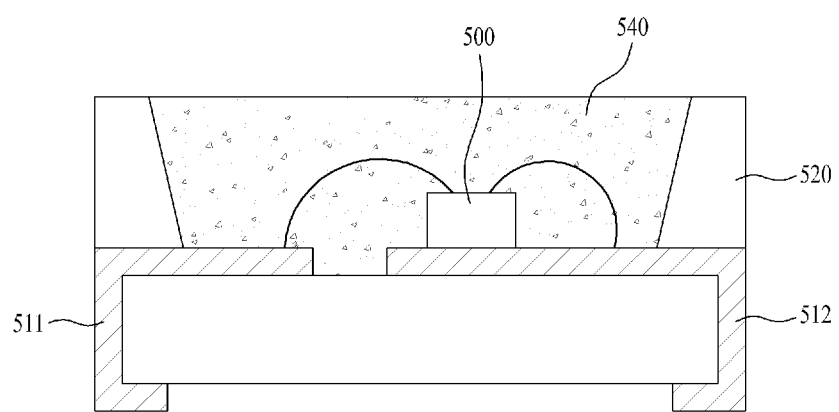
FIG. 8 is a sectional view illustrating a light emitting device package according to an embodiment of the present invention.

FIG. 8 is a sectional view illustrating a light emitting device package according to an embodiment of the present invention.

As shown in FIG. 8, the light emitting device package according to this embodiment includes a package body 520, first and second electrodes 511 and 512 installed in the package body 520, a light emitting device 500 according to the embodiments installed in the package body 520, with being electrically connected with the first and second electrodes 511 and 512, and a filling material 540 surrounding the light emitting device 500.

The package body 520 includes a silicon material, a synthetic material or a metal material. A slope is formed adjacent to the light emitting device 500 to enhance light extraction efficiency.

The first electrode 511 and the second electrode 512 are separated electrically from each other, and they provide the light emitting device 500 with electric voltages. In addition, the first and second electrodes 511 and 512 reflect a light generated from the light emitting device 500, only to improve light efficiency, and they exhaust the heat generated from the light emitting device 500 outside.

The light emitting device 500 may be installed on the package body 520 or either of the first electrode 511 and the second electrode 512.

The light emitting device 500 may be electrically connected with the first and second electrodes 511 and 512 by wire-bonding, flip chip-bonding or die-bonding.

The filling material 540 surrounds the light emitting device 500 to protect the light emitting device 500. A phosphor is provided in the filling material 540 and a wavelength of the light emitted from the light emitting device 500 may be changed.

The light emitting devices according to the embodiments described above may be mounted on the light emitting device package one by one or in plural, and the present invention is not limited thereto.

The plurality of the light emitting device packages according to the embodiment may be arrayed on a substrate. A light guide plate, a prism sheet and a diffuser sheet, which are optical elements, may be arranged on a light passage of the light emitting device package. Such the light emitting device package, the substrate and the optical elements may be functioned as light unit. Another embodiment of the present invention may be realized as a display device, a pointing device and a lightening system, which include the semiconductor light emitting device or the light emitting device package disclosed in the embodiments described above. For example, the lightening system may include a lamp and a streetlamp.

Figure 9:
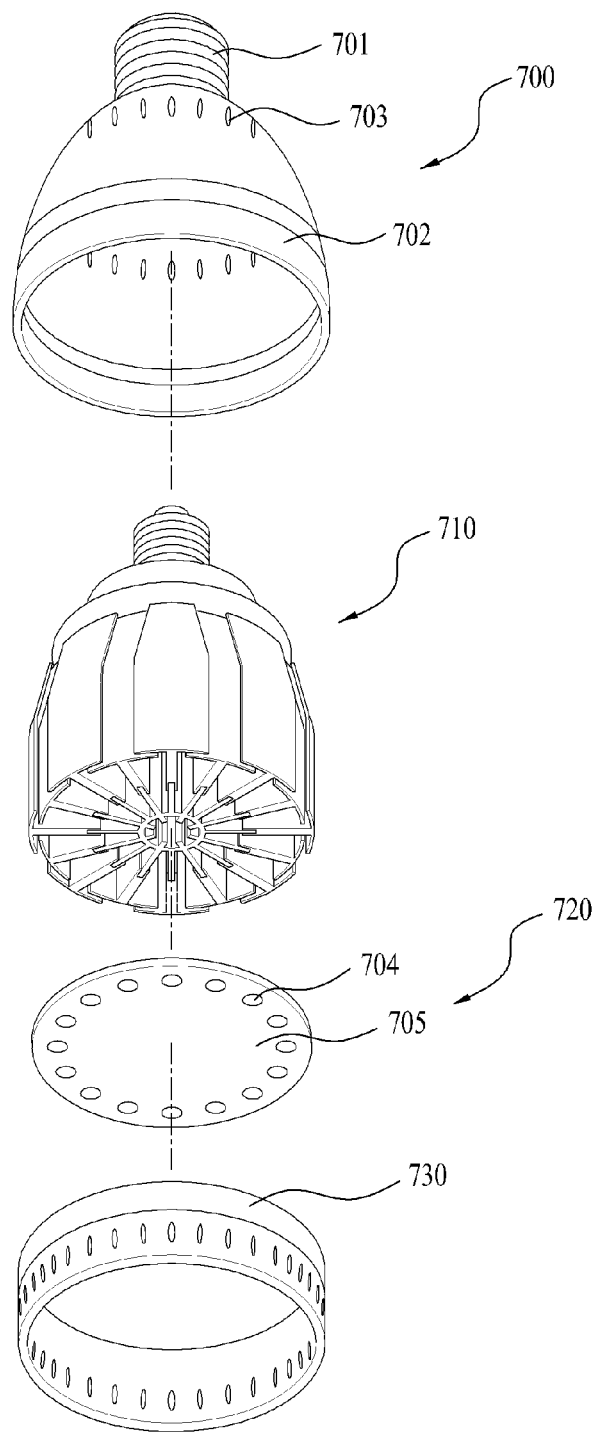
FIG. 9 is an exploded perspective view of a lighting apparatus including light emitting device packages in accordance with one embodiment.

FIG. 9 is an exploded perspective view of a lighting apparatus including light emitting device packages in accordance with one embodiment.

The lighting apparatus in accordance with this embodiment includes a light source 720 to project light, a housing 700 in which the light source 720 is installed, a heat dissipation unit 710 to dissipate heat generated by the light source 720, and a holder 730 to connect the light source 720 and the heat dissipation unit 710 to the housing 700.

The housing 700 includes a socket connector 701 connected to an electrical socket (not shown) and a body 702 connected to the socket connector 701 and accommodating the light source 720. One air flow hole 703 may be formed through the body 702.

In this embodiment, a plurality of air flow holes 703 is disposed on the body 702 of the housing 700. One air flow hole 703 may be formed, or plural air flow holes 703 may be disposed in a radial shape, in FIG. 6, or various other shapes.

The light source 720 includes a plurality of light emitting device packages 704 on a substrate 705. Here, the substrate 705 may have a shape which is capable of being inserted into an opening of the housing 700, and be formed of a material having high thermal conductivity so as to transfer heat to the heat dissipation unit 710, as described later.

The holder 730 is disposed under the light source 720. The holder 730 may include a frame and air flow holes. Further, although not shown in FIG. 9, optical members may be disposed under the light source 720 so as to diffuse, scatter or converge light emitted from the light emitting device packages 704 of the light source 720.

Figure 10A:
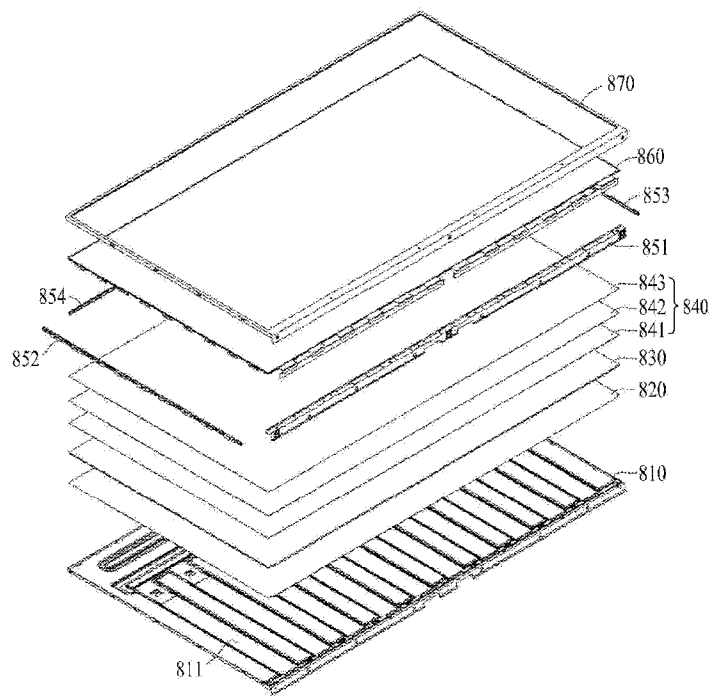
FIGS. 10A and 10B are views illustrating a backlight including light emitting device packages in accordance with one embodiment.
Figure 10B:
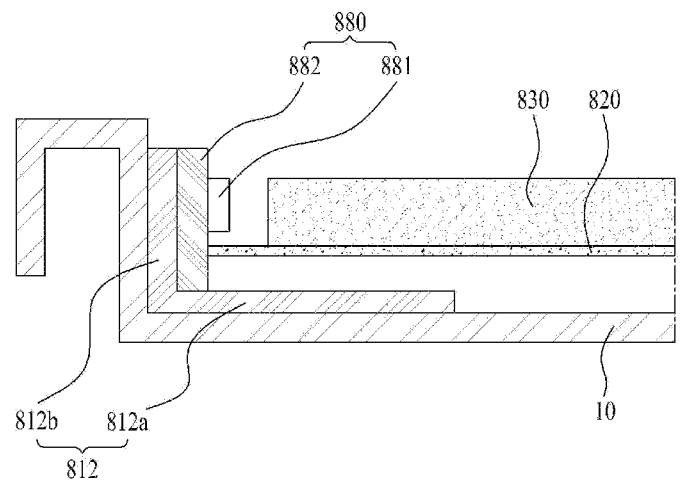

FIGS. 10A and 10B are views illustrating a backlight including light emitting device packages in accordance with one embodiment.

In FIGS. 10A and 10B, the backlight includes a bottom cover 810, a light emitting device package module (not shown) disposed at one side of the inside of the bottom cover 810, a reflective plate 820 disposed on the front surface of the bottom cover 810, a light guide panel 830 disposed in front of the reflective plate 820 to guide light emitted from the light emitting device package module to the front part of a display device, and optical members 840 disposed in front of the light guide panel 830. The display device including the backlight may further include, in addition to the above components, a liquid crystal display panel 860 disposed in front of the optical members 840, a top cover 870 disposed in front of the liquid crystal display panel 860, and fixing members 850 disposed between the bottom cover 810 and the top cover 870 to fix the bottom cover 810 and the top cover 870 together.

The light guide panel 830 serves to guide light emitted from the light emitting device package module (not shown) so as to convert the light into surface light. The reflective plate 820 disposed at the rear of the light guide panel 830 serves to reflect light emitted from the light emitting device package module (not shown) toward the light guide panel 830 so as to improve light efficiency.

The reflective plate 820 may be disposed as a separate component, in FIGS. 10A and 10B, or be disposed by coating the rear surface of the light guide panel 830 or the front surface of the bottom cover 810 with a material having high reflectivity.

Here, the reflective plate 820 may be formed of a material having high reflectivity and usable as an ultra-thin type, such as polyethylene terephthalate (PET).

Further, the light guide panel 830 scatters light emitted from the light emitting device package module so as to uniformly distribute the light throughout the entirety of a screen of the liquid crystal display device. Therefore, the light guide panel 830 is formed of a material having a high index of refraction and high transmittance, such as polymethylmethacrylate (PMMA), polycarbonate (PC) or polyethylene (PE).

The optical members 840 disposed on the light guide panel 830 diffuse light emitted from the light guide panel 830 by a designated angle. The optical members 840 enable light guided by the light guide panel 830 to be uniformly irradiated toward the liquid crystal display panel 860.

As the optical members 840, optical sheets, such as a diffusion sheet, a prism sheet and a protection sheet, may be selectively stacked, or a micro-lens array may be used. Here, a plurality of optical sheets may be used, and the optical sheets may be formed of a transparent resin, such as acrylic resin, polyurethane resin or silicon resin. Further, the prism sheet may include a phosphor sheet, as described above.

The liquid crystal display panel 860 may be disposed on the front surface of the optical members 840. Here, it will be apparent that, instead of the liquid crystal display panel 860, other kinds of display devices requiring a light source may be disposed.

FIG. 10B is a cross-sectional view of a light source part of the backlight.

In FIG. 10B, the reflective plate 820 is mounted on the bottom cover 810, and the light guide panel 830 is mounted on the reflective plate 820. Thereby, the reflective plate 820 may directly contact a heat dissipation member (not shown).

Printed circuit boards 881 to which light emitting device packages 882 are fixed may be bonded to a bracket 812. Here, the bracket 812 may be formed of a material having high thermal conductivity so as to discharge heat as well as to fix the light emitting device packages 882, and, although not shown in the drawings, heat pads may be disposed between the bracket 812 and the light emitting device packages 882 so as to facilitate heat transfer.

Further, the bracket 812 is disposed in an L shape, in FIG. 10B, a horizontal part 812a of the bracket 812 is supported by the bottom cover 810, and a vertical part 812a of the bracket 812 fixes the printed circuit boards 881.

As apparent from the above description, a light emitting device, a method of fabricating the same and a light emitting device package in accordance with one embodiment may be driven using AC power.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device, comprising:
   a light emitting structure comprising a first conductivity type semiconductor layer, an active layer, and a second conductivity type semiconductor layer;
   a reflective layer formed under the light emitting structure;
   a transparent supporting layer formed between the light emitting structure and the reflective layer; and
   a current blocking layer formed between the light emitting structure and the reflective layer,
   wherein the reflective layer comprises at least one projection part formed toward the light emitting structure, and an upper surface of the reflective layer and side surfaces of the at least one projection part contact the transparent supporting layer,
   wherein the projection part is vertically overlapped with the current blocking layer and horizontally overlapped with the transparent supporting layer.

2. The light emitting device as claimed in claim 1, further comprising:
   an ohmic layer and a protective layer formed under the light emitting structure,
   wherein the transparent supporting layer is formed under the ohmic layer and the protective layer, not under the current blocking layer.

3. The light emitting device as claimed in claim 1, further comprising:
   a conductive layer formed under the reflective layer.

4. The light emitting device as claimed in claim 3,
   wherein both opposite ends of the conductive layer are projected to surround the reflective layer.

5. The light emitting device as claimed in claim 1,
   wherein the transparent supporting layer is formed of an insulative material having a light transmissivity of 70% or more.

6. The light emitting device claimed in claim 1,
   wherein the transparent supporting layer is formed of at least one non-conductive material selected from the group consisting of silicon oxide ($SiO_2$), titanium oxide ($TiO_2$) and aluminum oxide ($Al_2O_3$).

7. The light emitting device as claimed in claim 6, further comprising
a current blocking layer formed between the light emitting structure and the reflective layer,
wherein
a projection part of the unevenness structure overlaps the current blocking layer in a thickness direction of the light emitting structure, and
the projection part of the unevenness structure overlaps the transparent supporting layer in a direction perpendicular to the thickness direction.

8. The light emitting device as claimed in claim 1,
wherein the thickness of the transparent supporting layer is in a range of 1 µm~100 µm.

9. The light emitting device as claimed in claim 1, further comprising:
a light extraction structure formed in a side surface of the transparent supporting layer.

10. The light emitting device as claimed in claim 1, wherein
the projection part overlaps the current blocking layer in a thickness direction of the light emitting structure, and
the projection part overlaps the transparent supporting layer in a direction perpendicular to the thickness direction.

11. A light emitting device, comprising:
a light emitting structure comprising a first conductivity type semiconductor layer, an active layer and a second conductivity type semiconductor layer;
a reflective layer formed under the light emitting structure; and
a transparent supporting layer formed between the light emitting structure and the reflective layer,
wherein the reflective layer comprises an unevenness structure comprising a multi-layered step structure, and the transparent supporting layer has a predetermined shape corresponding to a shape of the unevenness structure,
wherein an upper surface of the reflective layer and a side surface of the unevenness structure contact the transparent supporting layer, and the unevenness structure is horizontally overlapped with the transparent supporting layer.

12. The light emitting device as claimed in claim 11, wherein the transparent supporting layer is configured of a multilayer and the thickness of each layer is in a range of 1 µm~100 µm.

13. The light emitting device as claimed in claim 11, further comprising:
a conductive layer formed under the reflective layer.

14. The light emitting device as claimed in claim 13,
wherein both opposite ends of the conductive layer are projected to surround the reflective layer.

15. The light emitting device as claimed in claim 11,
wherein the transparent supporting layer is formed of an insulative material having a light transmissivity of 70% or more.

16. The light emitting device claimed in claim 11,
wherein the transparent supporting layer is formed of at least one non-conductive material selected from the group consisting of silicon oxide (SiO2), titanium oxide (TiO2) and aluminum oxide (Al2O3).

17. The light emitting device claimed in claim 11, further comprising:
a light extraction structure formed in a side surface of the transparent supporting layer.

18. The light emitting device claimed in claim 11,
wherein a predetermined region of the transparent supporting layer is in contact with the light emitting structure by passing through an ohmic layer.

19. The light emitting device claimed in claim 11, further comprising:
an ohmic layer, a protective layer and a current blocking layer formed under the light emitting structure, wherein the transparent supporting layer is formed under the ohmic layer and the protective layer, not under the current blocking layer.

* * * * *